(12) United States Patent
Clark et al.

(10) Patent No.: US 6,230,392 B1
(45) Date of Patent: May 15, 2001

(54) SYSTEM FOR MOUNTING AN ELECTRICAL CONNECTOR ON A PRINTED WIRING BOARD

(75) Inventors: Stephen L. Clark, Dillsburg; David C. Horchier, Millersburg; Stuart C. Stoner, Lewisberry; Glenn J. Pontius, New Cumberland; William K. Nailor, III, Camp Hill, all of PA (US)

(73) Assignee: Berg Technology, Inc., Reno, NV (US)

(*) Notice: Subject to any disclaimer, the term of this patent is extended or adjusted under 35 U.S.C. 154(b) by 0 days.

(21) Appl. No.: 09/431,397

(22) Filed: Nov. 1, 1999

Related U.S. Application Data (60) Continuation of application No. 09/013,491, filed on Jan. 26, 1998, now Pat. No. 6,038,762, which is a division of application No. 08/443,789, filed on May 17, 1995, now Pat. No. 5,815,917.

(51) Int. Cl.[7] .................................................. B23P 19/00
(52) U.S. Cl. ............................. 29/739; 29/741; 29/845
(58) Field of Search .............................. 29/739, 741, 845, 29/837, 842

(56) References Cited

U.S. PATENT DOCUMENTS

| | | |
|---|---|---|
| 2,856,593 | 10/1958 | Gookin . |
| 3,980,367 | 9/1976 | Laserson et al. . |
| 4,287,667 | 9/1981 | Urushiyama . |
| 4,328,613 | 5/1982 | Kirkpatricik . |
| 4,717,219 | 1/1988 | Franz et al. . |
| 4,719,695 | 1/1988 | Sturner . |
| 4,721,470 | 1/1988 | Humphrey . |
| 4,812,130 | 3/1989 | Altenschulte et al. . |
| 4,884,336 | 12/1989 | Waters et al. . |
| 4,953,061 | 8/1990 | Nitkiewicz . |
| 5,066,237 | 11/1991 | Shiley . |
| 5,108,308 | 4/1992 | Northcraft et al. . |
| 5,230,639 | 7/1993 | Schuppert, Jr. . |
| 5,277,618 | 1/1994 | Mitra . |
| 5,392,510 | 2/1995 | Chapman . |
| 5,762,523 | 6/1998 | Clark et al. . |

FOREIGN PATENT DOCUMENTS

| | | |
|---|---|---|
| 393 568 | 10/1990 | (EP) . |
| 0598 492 A1 | 5/1994 | (EP) . |
| 0 743 704 A2 | 11/1996 | (EP) . |
| 1196457 | 6/1970 | (GB) . |

*Primary Examiner*—Stephen F. Gerrity
*Assistant Examiner*—Rhonda E. Sands
(74) *Attorney, Agent, or Firm*—Brian J. Hamilla; M. Richard Page (57) ABSTRACT

Disclosed is a method and apparatus for mounting an electrical connector on a printed wiring board. The printed wiring board is initially positioned on locating projections on a tooling plate. Eyelets are positioned in hold down apertures in the connector. The hold down apertures initially engage the locating projections to align the connector pins with pin receiving apertures on the printed wiring board. Engagement continues until the pins are positioned in the apertures and the lower end of the eyelet is deformed to engage the innerside of the down aperture and the lower side of the printed wiring board.

9 Claims, 8 Drawing Sheets

SYSTEM FOR MOUNTING AN ELECTRICAL CONNECTOR ON A PRINTED WIRING BOARD

CROSS-REFERENCE TO RELATED APPLICATIONS

This application is a continuation of Ser. No. 09/013,491, filed on 26 Jan. 1998 and now U.S. Pat. No. 6,038,762, which is a divisional of Ser. No. 08/443,789, filed on 17 May 1995 and now U.S. Pat. No. 5,815,917, both of which are herein incorporated by reference.

BACKGROUND OF INVENTION

1. Field of the Invention

The present invention relates to electrical connectors and more particularly to methods and apparatus for attaching electrical connectors to a substrate.

2. Brief Description of the Prior Developments

In the assembly of electronic devices it is frequently necessary to mount connectors having a plurality of signal pins or pin like elements on a printed wiring board or on other substrates. There will ordinarily be a plurality of pin receiving apertures on the surface of the printed wiring board and conventionally each of the pins on the connector will be aligned with one of the pin receiving apertures and the connector will then be engaged with the wiring board. The connector will also often be equipped with a pair of mounting brackets at its opposed ends. Each of these brackets will have a hold down aperture which is aligned with a hold down aperture on the printed wiring board. An eyelet, rivet or any other number of well known commercial fasteners may be inserted through these hold down apertures to fix the connector to the wiring board but only after the signal pins have first been aligned with them inserted into their respective pin receiving apertures.

The method as described above for fixing a connector to a printed wiring board has several disadvantages. First, the alignment of the signal pins with the pin receiving apertures is a rather exacting procedure which must be accomplished within close tolerances. Further, the conventional method as described above involves two distinct procedures in that the eyelet is not attached to the connector and the wiring board until the signal pins have first been aligned with them and inserted into the pin receiving apertures. The carrying out of these two distinct procedures may result in a significant addition to the time and expense required for the overall assembly operation. A need, therefore, exists for a method and apparatus for mounting a connector on a printed wiring board or other substrate which can be performed quickly and efficiently in essentially a single integral procedure.

SUMMARY OF THE INVENTION

In the method and apparatus of the present invention the hold down apertures of the connectors are first superimposed and aligned with locating projections which extend perpendicularly upwardly from a tooling plate. The connector is then lowered toward the tooling plate until the hold down apertures are initially engaged with the tooling projection. Downward motion of the connectors continues until the pins first engage then are seated in the pin receiving apertures in the printed wiring board and the hold down apertures are fully engaged with the locating projection. An axial force is then applied downwardly to the eyelet against a deformation means in the tooling plate to bend the eyelet to engage the printed wiring board within its thickness and on its lower side. The eyelet also engages the connector on its upper side so as to fix the connector to the printed wiring board. By the term "eyelet" what is meant is any type of tubular rivet or other fastener which can concentrically engage a projection that fits through an aperture.

BRIEF DESCRIPTION OF THE DRAWINGS

The method and apparatus of the present invention is further described with reference to the accompanying drawings in which.

DETAILED DESCRIPTION OF THE PREFERRED EMBODIMENTS

Figure 1:
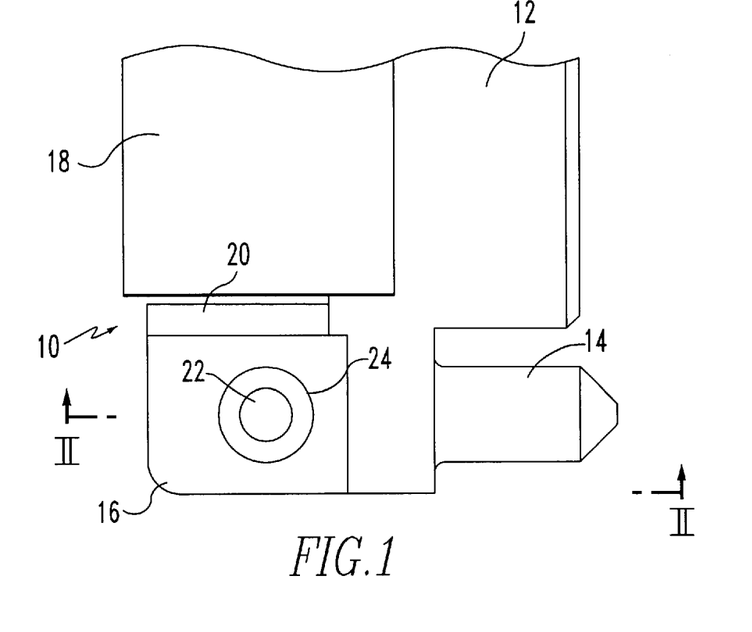
FIG. 1 is a top plan view in fragment of a connector showing one hold down bracket.
Figure 2:
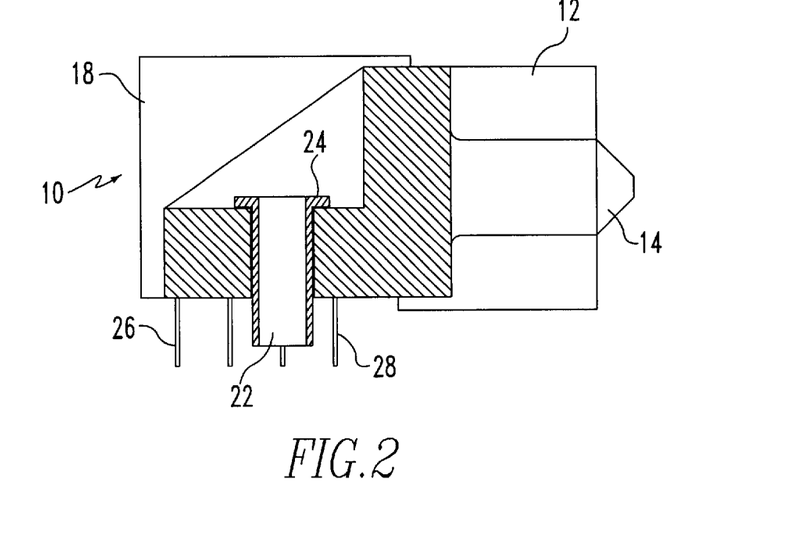
FIG. 2 is a vertical cross sectional view through line II—II in FIG. 1.

Referring to FIGS. 1 and 2, a connector is shown generally at numeral 10. This connector includes a receptacle 12, a guide pin 14, a mounting bracket 16, a press block 18 and an end wall 20 positioned between the bracket and the press block It will be understood that there is shown only one end of the connector and at the other end there will be a similarly positioned and essentially identical mounting bracket and guide pin. It will also be seen that the mounting bracket includes a hold down aperture 22 in which there is positioned an annular rivet which is also commonly referred to as an eyelet 24. Signal pins as at 26 and 28 extend downwardly from the press block.

Figure 3A:
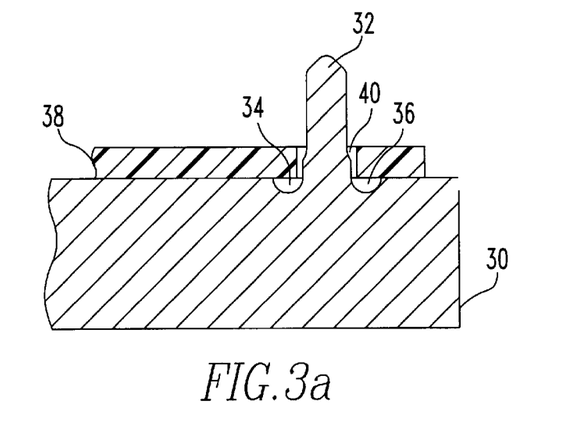
FIGS. 3a–f are schematic illustrations of the connector, the printed wiring board and the mounting apparatus showing successive steps in the method of the present invention.

Referring to FIGS. 3a–3f, a preferred embodiment of the method of the present invention is illustrated in greater detail. Referring particularly to FIG. 3a, it will be seen that in the first step of this method a tooling plate 30 is provided which has an upwardly extending perpendicular locating projection 32 along with deformation recesses as at 34 and 36. The functions of this projection and deformation recesses will be explained hereafter. A printed wiring board 38 having a pair of apertures as at 40 is positioned so that the apertures are engaged with the locating projections of the tooling plate and the printed wiring board abuts the tooling plate in side to side relation.

Figure 3B:
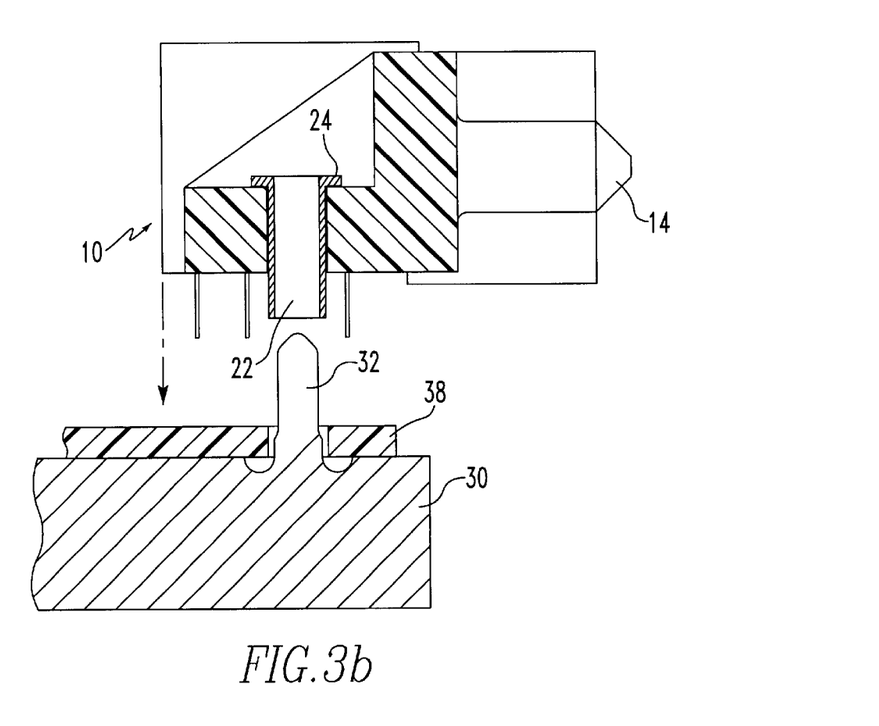
Figure 3C:
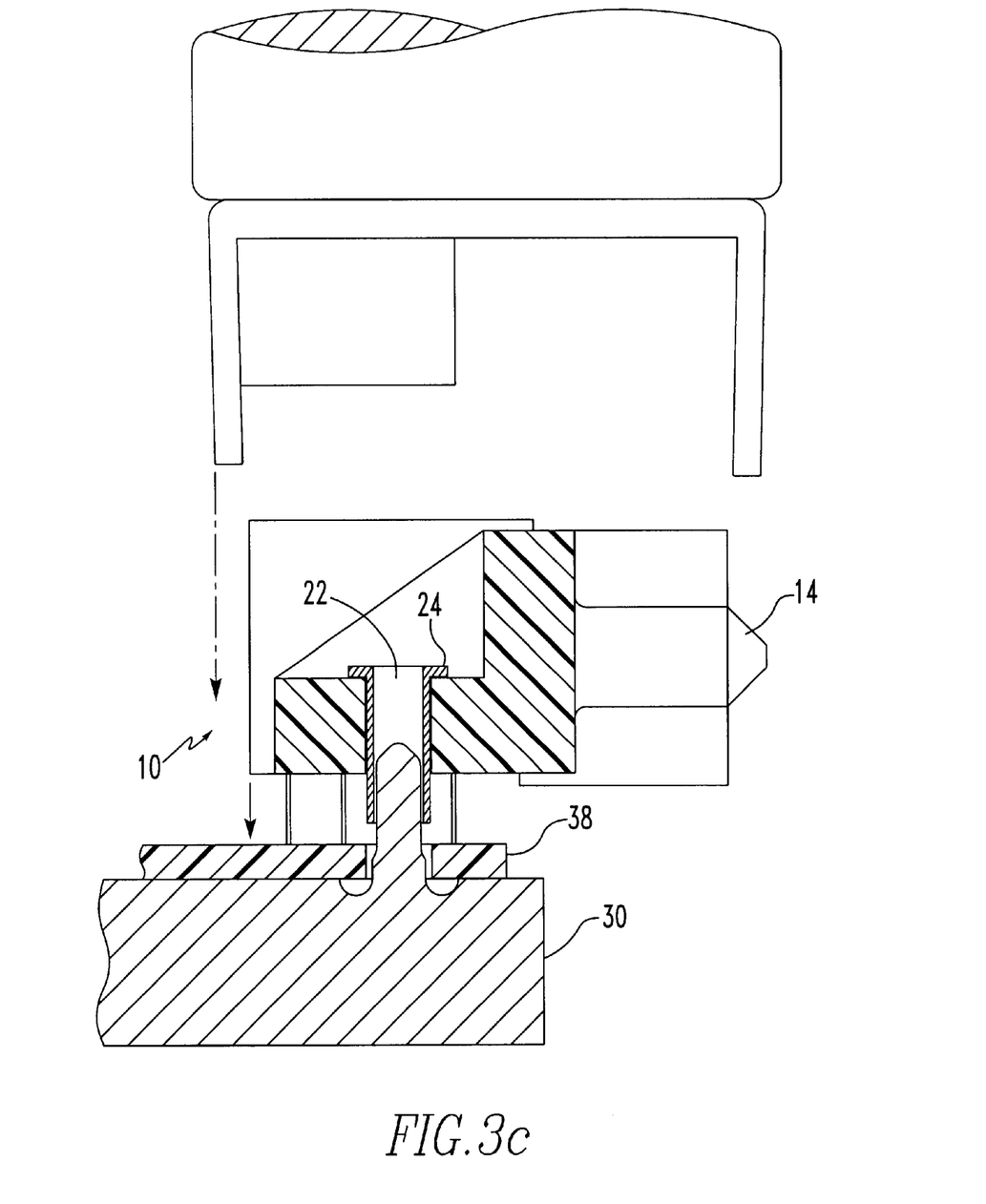
Figure 3D:
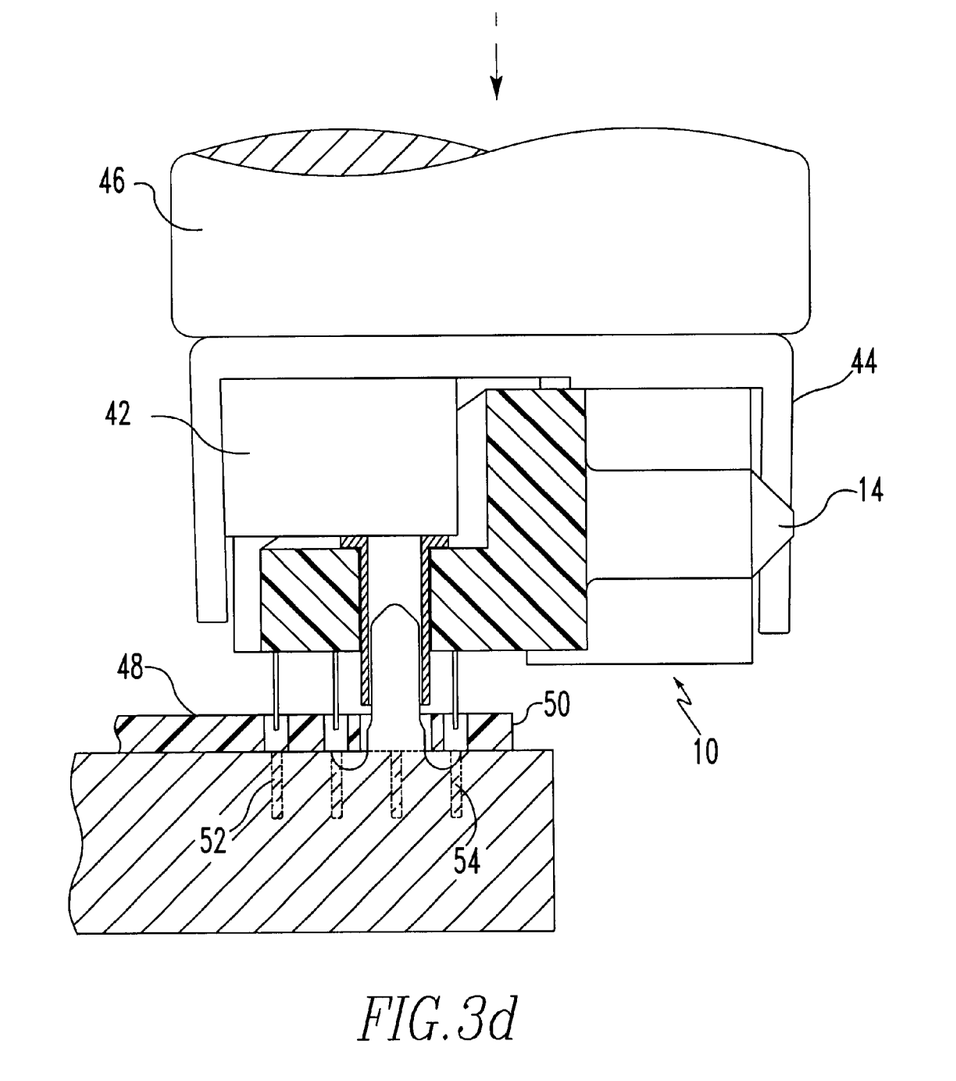
Figure 3E:
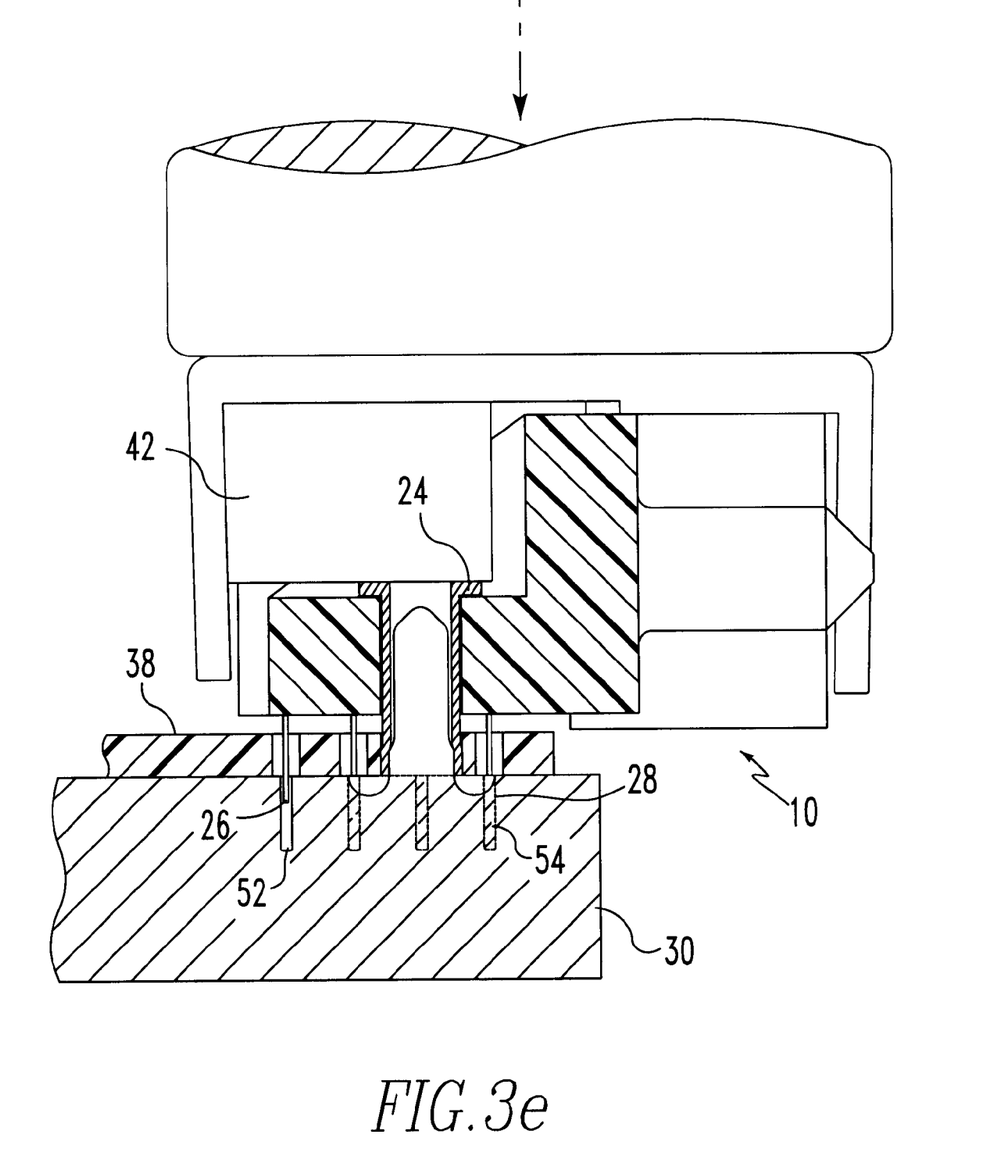
Figure 3F:
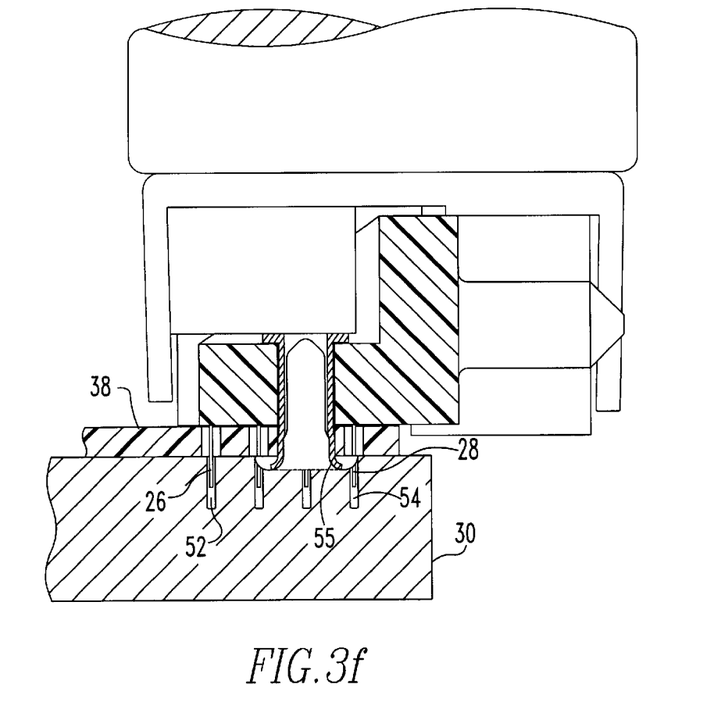
Figure 4:
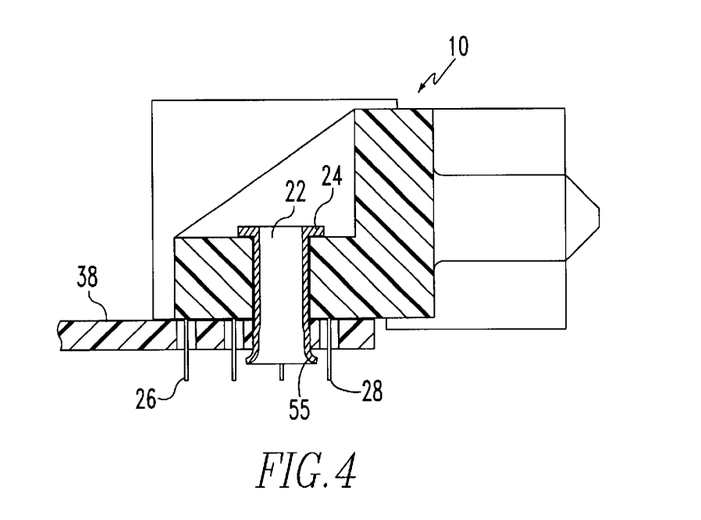
FIG. 4 is a schematic illustration of the connector and printed wiring board showing the final connected assembly.

Referring particularly to FIG. 3b, the connector is then superimposed over the printed wiring board and the tooling plate so that it's hold down apertures and the concentric eyelet are in vertical alignment with the locating projections at the tooling plate. In the next step of the method the eyelet is initially engaged with the locating projection as is shown in FIG. 3c. It will be noted from FIG. 3c that upon the initial engagement of the hold down aperture and the eyelet with the locating projection that the pins of the connectors are not yet engaged with a respective pin receiving aperture in the printed wiring board. Referring particularly to FIG. 3d, it will be seen that additional tooling is then provided by way of an eyelet support block 42 which is superimposed above the mounting bracket and in particular the hold down aperture and the eyelet. There is also a U-shaped channel 44 which is positioned above the eyelet support block and the connector. Above the U-shaped channel there is also a ram 46 which pushes downwardly on the connector. The action of this ram will result in the pins as at 26 and 28 engaging pin receiving apertures as at 48 and 50 in the printed wiring board. It will also be noted that there are pin receiving recesses as at 52 and 54 positioned immediately beneath each of the pin receiving apertures in the printed wiring board. At this stage of the method shown in FIG. 3d, however, the pins have not yet entered these pin receiving apertures. Referring particularly to FIG. 3e it will be seen that downward pressure by the ram continues in this method until the pins pass through the pin receiving apertures in the printed wiring board and enter the pin receiving recesses in the tooling plate. It will also be seen from FIG. 3e that the eyelet is pushed downwardly against deformation means at the base of the locating projection. This deformation means will preferably be an expanded lower section of the locating projection which will be disclosed hereafter in greater detail. Such downward axial pressure on the eyelet continues until the lower end of the eyelet will be crimped as at 55 as is shown in FIG. 3f. Upon the completion of this method, the tooling plate is removed to leave an assembly such as is shown in FIG. 4 wherein the eyelet engages the connector at its top and the printed wiring board at its bottom by means of crimp 55 to affix these elements together.

Figure 5:
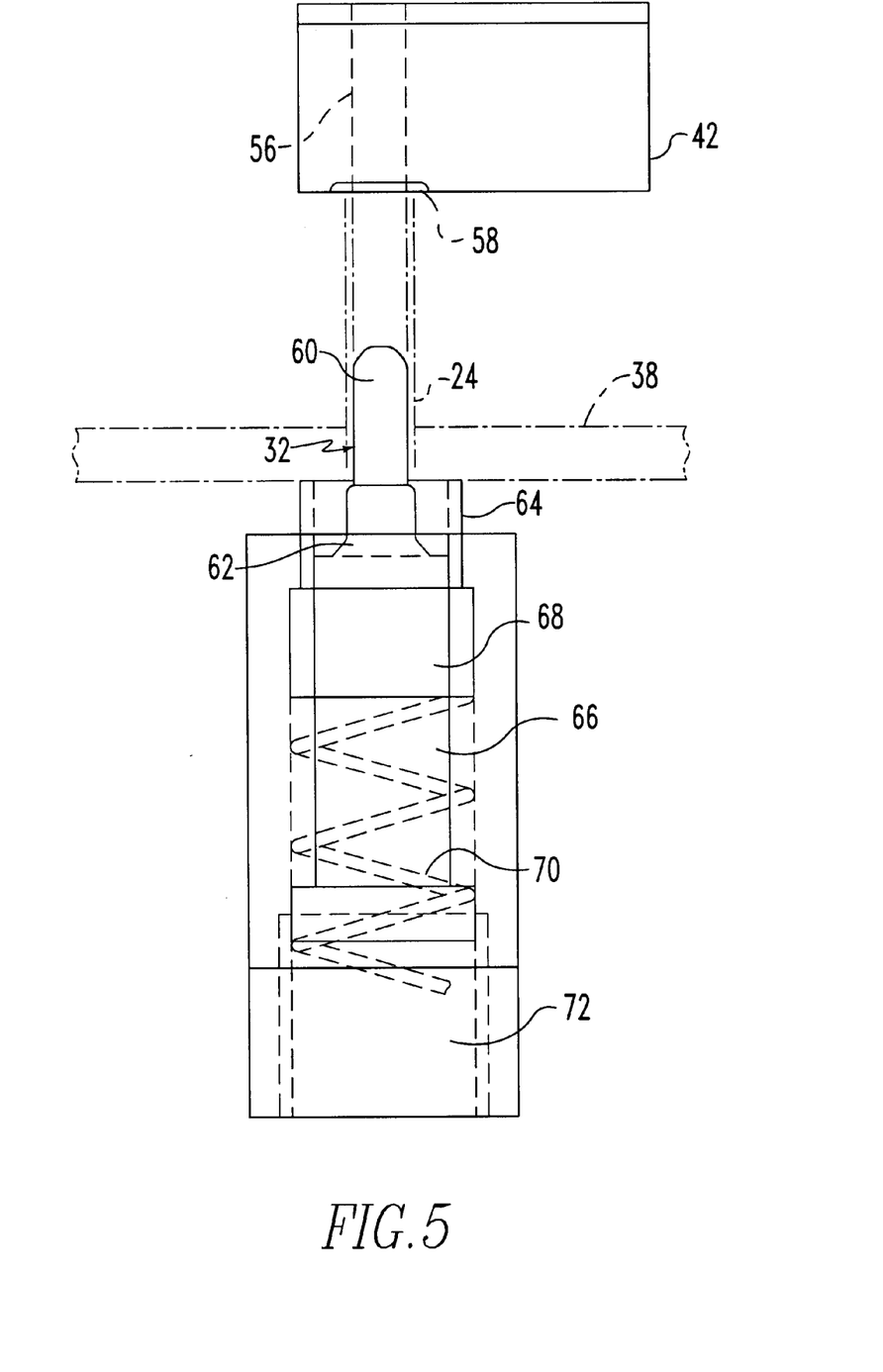
FIG. 5 is a vertical cross sectional view of the locating projection element of the apparatus used in the method of the present invention.

Referring to FIG. 5, the engagement of the locating projection, eyelet support block, the eyelet and the printed wiring board is shown in further detail. It will be seen that the eyelet support block has a vertical bore 56 with a rivet receiving recess 58 on its lower side. The locating projection has an upper nipple 60 and a lower axially expanded deformation section 62. Outwardly from this deformation section there is an annular collar 64. Beneath the locating projection in the tooling plate there is also an axial bore 66 in which there is a plug 68 which is at the upper end of a spring 70 which is attached at its lower end to a projection spring base 72. The eyelet 24 is positioned over the nipple of the locating projection and is retained at its lower end between that nipple and the annular collar and at its upper end in the recess of the eyelet support block. As downward axial pressure is applied to the eyelet its lower section is deformed outwardly by the lower flared deformation section of the locating projection. That lower portion is received in the deformation recesses so that a crimp is formed as at shown at numeral 55 in FIG. 4. While such downward axial pressure is applied to the eyelet, spring 70 is compressed in the axial bore 66. After the lower end of the rivet has been crimped and the downward axial pressure is removed the spring expands to at least partially remove the printed wiring board from the locating projection.

Figure 6:
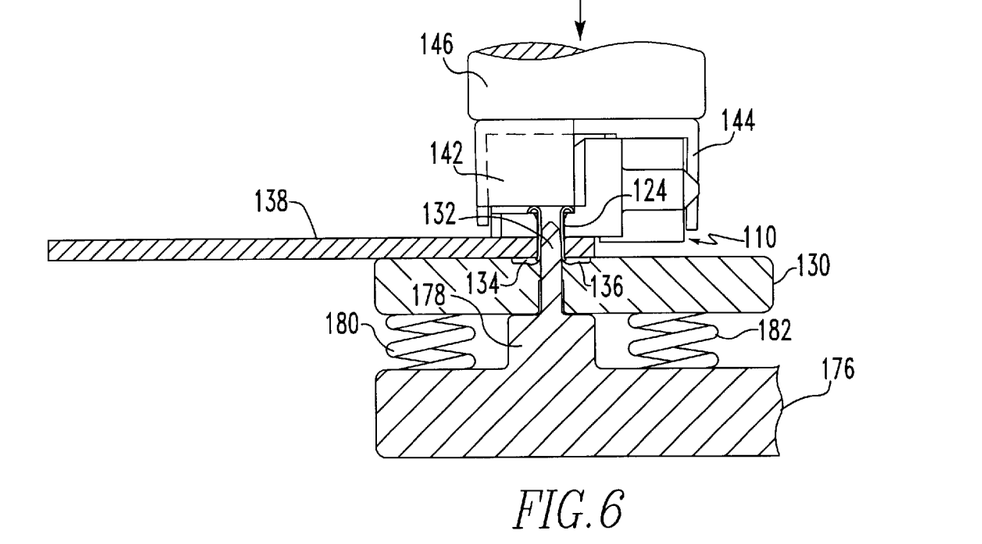
FIG. 6 is a schematic end view of an alternate embodiment of the apparatus of the present invention.

Referring to FIG. 6, a second preferred embodiment of the method and apparatus of the present invention is illustrated. In this embodiment a connector shown generally at numeral 110 and being essentially identical to those shown in FIGS. 1 and 2 has been positioned with a eyelet 124 on an upper tooling plate 130 with a perpendicular locating projection as at 132 with deformation recesses 134 and 136. In a manner similar to that described in the first embodiment, a printed wiring board 138 is also engaged with the locating projections between the connector and the upper tooling plate in a manner similar to that described in connection with the first embodiment. The upper tooling plate 130 is itself superimposed over a base plate 176 which has a medial raised section 178 from which the projection extends. Interposed between the upper tooling plate and the base plate are vertical springs 180 and 182. In this apparatus the connector is engaged with the printed wiring board in a manner similar to that described above, as is the locating projection is inserted into the aperture 122. The springs 180 and 182 are in a generally expanded position until the eyelet is seated in the deformation recesses and deformed by a lower axially expanded section of the projection. As downward axial pressure is then applied to deform the lower end of the eyelet the springs yield to this pressure as the eyelet is crimped. After the eyelet is crimped and the downward axial pressure is removed from it the springs force the upper tooling plate upward to at least partially remove the rivet from the upward locating projection.

Figure 7:
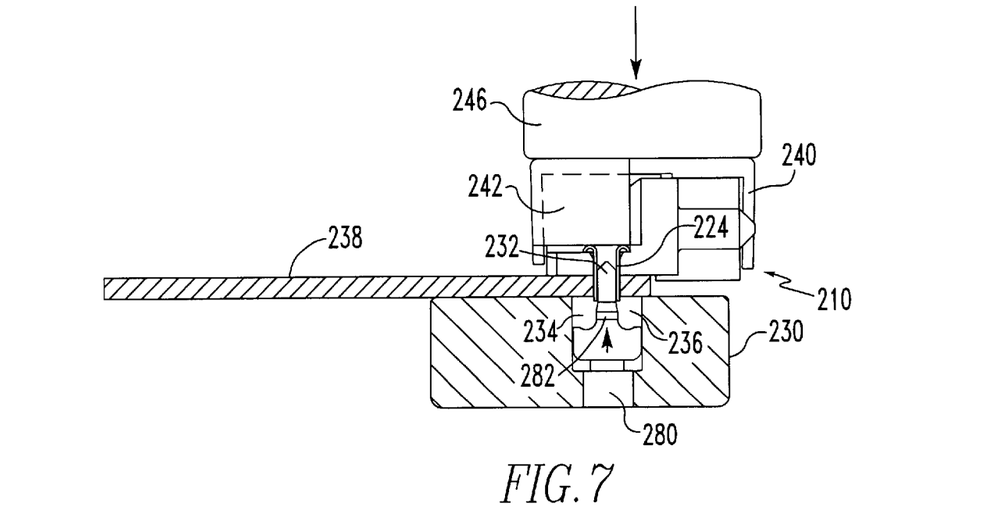
FIG. 7 is a schematic end view of another alternate embodiment of the apparatus of the present invention.

Referring to FIG. 7, a third preferred embodiment of the method and apparatus of the present invention is illustrated. In this embodiment a connector which is shown generally at numeral 210 is essentially similar to the one described in conjunction with FIGS. 1 and 2. This connector is mounted with eyelet 224 over tooling plate 230 which has a locating projection 232 which is positioned inside eyelet 224. In a manner similar to the embodiments described above, the apparatus of the embodiment includes an eyelet support block 242, a U-shaped channel 244 and a ram 246. In this embodiment the connector is fixed to the printed wiring board in a manner as was described in the first two embodiments. After the eyelet has been moved downwardly to the deformation recesses 234 and 236, a solenoid 280 is automatically activated to move the projection 236 upwardly. In this embodiment, an expanded section 282 of the locating projection deforms the eyelet during the upward motion of the projection. The upward motion of the projection also causes the wiring board to at least partially disengage from the eyelet 224.

It will be appreciated that there has been described a method and apparatus for mounting a connector to a printed wiring board or other substrate which enables the eyelets or tubular rivets and the signal pins to be mounted in their respective apertures in one quick and efficient operation and which takes advantage of the need to mount those eyelets to easily align the signal pins with their pin receiving apertures.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A system for mounting an electrical connector to a circuit substrate, the circuit substrate having a first surface, a second surface and at least one aperture extending between the first and second surfaces, said system comprising:
    an electrical connector positionable adjacent the first surface of the circuit substrate, including:
        a body;
        electrical contacts connected to said body;
        an opening in said body; and
        a securing member in said opening and having:
            a first end extending from one end of said opening and located directly against the body over a portion of the body; and
            an open second end extending from an opposite end of said opening and adapted to extend through the aperture in the circuit substrate; and a tool positionable adjacent the second surface of the circuit substrate, including:
- an alignment member extendable into the aperture in the circuit substrate to guide said securing member into the aperture before said securing member is inserted into the aperture; and
- a deforming member adapted to receive said securing member and to deform said second end, thereby mounting said connector to the circuit substrate.

2. The system as recited in claim 1, wherein said securing member is tubular.

3. The system as recited in claim 1, wherein said opening in said body and a hole through said securing member are concentric.

4. The system as recited in claim 1, wherein said first end of said of said securing member has an enlarged head to retain said securing member in said opening.

5. The system as recited in claim 1, wherein said alignment member is a projection and said deforming member is a recess adjacent said projection.

6. The system as recited in claim 1, wherein said tool is spring-loaded.

7. The system as recited in claim 1, wherein said connector further comprises contacts extending from said body and said tool includes openings to receive said contacts as said deforming member deforms said second end of said securing member.

8. The system as recited in claim 1, further comprising a press tool to force said securing member against said deforming member of said tool.

9. The system as recited in claim 1, wherein said securing member is an eyelet.

* * * * *